(12) United States Patent
Tokuhiro et al.

(10) Patent No.: US 7,154,981 B2
(45) Date of Patent: Dec. 26, 2006

(54) TERMINATION CIRCUIT

(75) Inventors: Noriyuki Tokuhiro, Kawasaki (JP); Kunihiro Itoh, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 17 days.

(21) Appl. No.: 10/982,778

(22) Filed: Nov. 8, 2004

(65) Prior Publication Data

US 2006/0022701 A1   Feb. 2, 2006

(30) Foreign Application Priority Data

Jul. 29, 2004   (JP) ............................. 2004-221673

(51) Int. Cl.
  *H03K 17/16*   (2006.01)
(52) U.S. Cl. ............................. 376/30; 376/32; 376/87
(58) Field of Classification Search ............ 326/30–34, 326/87
  See application file for complete search history.

(56) References Cited

U.S. PATENT DOCUMENTS 6,147,520 A    11/2000  Kothandaraman et al.
6,351,136 B1 *  2/2002  Jones et al. .................... 326/30
6,556,039 B1    4/2003  Nagano et al.
2002/0053923 A1 *  5/2002  Kim et al. ..................... 326/30
2005/0194991 A1 *  9/2005  Dour et al. .................... 326/30

FOREIGN PATENT DOCUMENTS

JP    2002-344300    11/2002

OTHER PUBLICATIONS

Search Report for European Patent Application No. 04025776.8-2215 mailed Nov. 30, 2005.
Search Report for European Patent Application No. 04025776.8-2215 mailed Nov. 30, 2005.

* cited by examiner

*Primary Examiner*—Anh Q. Tran
(74) *Attorney, Agent, or Firm*—Staas & Halsey LLP

(57) ABSTRACT

A termination circuit for terminating a transmission line comprises a resistance unit which is formed by connecting a P-channel type MOS transistor and an N-channel type MOS transistor in parallel, and Thevenin termination is formed by providing this resistance unit between the transmission line and a power supply line and between the transmission line and a ground line.

20 Claims, 4 Drawing Sheets

TERMINATION CIRCUIT

BACKGROUND OF THE INVENTION

1. Field of the Invention

The present invention relates to a signal transmission technology, more particularly to a technology for a termination circuit for matching a plurality of segments of impedance of a transmission line.

2. Description of the Related Art

In a memory interface based on double data rate 2 (DDR2) rating stipulated by Joint Electron Device Engineering Council (JEDEC), it is required that a termination circuit should be provided on the controller side of memory.

It is required that the termination circuit on the controller side in a DDR2 interface is activated when a controller receives data, and it is inactivated when the controller transmits data. It is stipulated that the matched impedance of a transmission line should be 75 ohms. Therefore, if a controller and memory are connected 1 to 1, the termination resistance value is made to be 75 ohms. However, if a controller and memory are connected 1 to 2, the terminal resistance value can be switched to 150 ohms. Furthermore, the termination circuit is required to form Thevenin termination.

One configuration of a termination circuit for meeting such a requirement is shown in FIG. 1.

In FIG. 1, four resistors 101a, 101b, 101c and 101d are disposed in each data transmission line leading to memory 200 in a controller 100. The resistors 101a and 101c are connected in parallel between a transmission line and a power supply line, and the resistors 101b and 101d are connected in parallel between the transmission line and a ground line. The resistance value of each of the resistors 101a, 101b, 101c and 101d is 300 ohms. Therefore, this circuit forms Thevenin termination and its termination resistance value becomes 75 ohms.

In this case, if one resistor between the transmission line and the power supply line (for example, resistor 101c) and one resistor between the transmission line and the ground line (for example, resistor 101d) of the four resistors 101a, 101b, 101c and 101d is severed from the transmission line, its termination resistance value becomes 150 ohms while the Thevenin termination is maintained by the remaining ones (for example, resistors 101a and 101b). If the four resistors 101a, 101b, 101c and 101d are all further severed from the transmission line, the termination circuit is inactivated.

One detailed configuration of the termination circuit on the semiconductor substrate in a semiconductor device is shown in FIG. 2. In FIG. 2, P-channel type metal oxide semiconductor (MOS) transistors 111a and 11c provided between a transmission line 102 and a power supply line 103 correspond to the resistors 101a and 101c, respectively, and N-channel type MOS transistors 111b and 111d correspond to the resistors 101b and 101c, respectively.

P-channel type MOS transistors 111e and N-channel type MOS transistor 111f are used to connect/disconnect the P-channel type MOS transistor 111a and 111c and the N-channel type MOS transistors 111b and 111d to/from the transmission line 102, and are formed in such a way that the resistance value (so-called "on resistance") between the drain terminal and the source terminal can be made sufficiently low when operating them in a saturation region.

The P-channel type MOS transistors (hereinafter called "P-type transistor") 111a and 111c are switched on if the signal level of its gate terminal is L (low level), and the N-channel type MOS transistors (hereinafter called "N-type transistor") 111b and 111d are switched on if the signal level of its gate terminal is H (high level). In this case, its gate width is formed in such a way that the on resistance of each of the P-type transistors 111a and 111c and the N-type transistors 111b and 111d can become 300 ohms. Therefore, if the respective signal levels of the gate terminals of these transistors 111a, 111b, 111c and 111d are all controlled so as to be switched on, this circuit forms Thevenin termination and its termination resistance value becomes 75 ohms.

In this case, if one of the P-type transistors 111a and 111c (for example, P-type transistor 111c) and one of the N-type transistors 111b and 111d (for example, N-type transistor 111d) are controlled so as to be switched off, its terminal resistance value becomes 150 ohms while the Thevenin termination are maintained by the remaining transistors (for example, P-type transistor 111a and N-type transistor 111b). Furthermore, if the signal level of each of the gate terminals of the P-type transistor 111e and the N-type transistor 111f is controlled so as to be switched off, the termination circuit is inactivated.

Since the termination circuit shown in FIG. 2 utilizes the respective on resistance of transistors 111a, 111b, 111c and 111d, the termination circuit has the following problems.

(1) If the gate threshold voltage of each of the P-type transistors 111a and 111c is expressed by VthP, the proportional relationship between voltage change ΔVDs and current change ΔIds between the drain terminal and the source terminal degrades when the potential of the transmission line 102 drops below the VthP, and the resistance value between the transmission line 102 and the power supply line 103 exceeds a target value.

(2) If the gate threshold voltage of each of the N-type transistors 111b and 111d, and voltage between the gate terminal and the source terminal at the time of on operation are expressed by VthN and Vgs (that is, potential VDD of the power supply line 103), respectively, the proportional relationship between voltage change ΔVDs and current change ΔIds caused between the drain terminal and the source terminal degrades when the potential of the transmission line 102 exceeds Vgs-VthN, and the resistance value between the transmission line 102 and the ground line 104 exceeds a target value.

Therefore, the terminal resistance value varies depending on a transmission signal if viewed from the transmission line 102 side, and the signal transmission quality of the transmission line 102 degrades.

For this problem, for example, Japanese Patent Application No. 2002-344300 discloses a technology for suppressing the dispersion of termination resistance values by enabling a transistor used to operate as a termination resistor in a non-saturation region and also controlling the gate terminal voltage of a transistor based on a reference resistance to obtain proper on resistance.

However, this technology requires an analog circuit for generating gate terminal voltage for proper on resistance in a transistor based on the reference resistance.

For example, in the termination circuit of a memory interface, a lot of transistors must be provided as resistors since there are a lot of transmission lines. However, it is often difficult in connection with other circuits to unify a plurality of wiring layouts to the gate terminal of each transistor. Therefore, in the technology disclosed in the Japanese Patent Application No. 2002-344300, voltage to be supplied to the gate terminal cannot be unified among transistors due to these different wiring layouts. As a result, the on operation resistance values cannot be unified, and the transmission line cannot always be sufficiently matched.

SUMMARY OF THE INVENTION

It is an object of the present invention to improve the matching characteristic of a termination circuit using a transistor as a termination resistor.

A termination circuit in one aspect of the present invention terminates a transmission line. The termination circuit comprises a resistance unit which is formed by connecting a P-channel type metal oxide semiconductor (MOS) transistor and an N-channel type MOS transistor in parallel, and Thevenin termination is formed by providing this resistance unit between the transmission line and the power line and between the transmission line and the ground line.

The potential range of the transmission line in which the respective resistance characteristics of a P-channel type MOS transistor and an N-channel type MOS transistor both degrade is very narrow. Therefore, if the connection of both the transistors is used as termination resistance, as described above, the degradation of the signal transmission quality of the transmission line can be suppressed more, compared with a case where both the transistors are used without being combined by their parallel connection.

In the above-mentioned termination circuit of the present invention, the P-channel type and the N-channel type MOS transistors can also be formed in such a way that the sum of the respective gate threshold voltage of the P-channel type and N-channel type MOS transistors composing the above-mentioned resistance unit can drop below the power supply voltage of the above-mentioned circuit.

As long as the resistance unit is formed in such a way as to meet the above-mentioned requirements, the respective resistance characteristics of the parallel connection of P-channel type and N-channel type MOS transistors at the time of on operation both do not always degrade simultaneously. Therefore, the change of the resistance characteristic of the resistance unit due to the signal level of the transmission line can be far more sufficiently suppressed.

The above-mentioned termination circuit of the present invention can also further insert a plurality of resistance units between the above-mentioned transmission line and the above-mentioned power line and between the transmission line and the above-mentioned ground line and further comprise a control unit for individually controlling each of the resistance units to switch the on/off operation of the P-channel type and the N-channel type MOS transistors composing the resistance unit.

According to this configuration, since the resistance value of each resistance unit can be adjusted, the transmission line can be more appropriately matched.

In this case, the serial connection between the above-mentioned parallel connection of the plurality of resistance units and a resistance device can also be provided between the above-mentioned transmission line and the above-mentioned power supply line and between the transmission line and the above-mentioned ground line.

In this case, for the resistance device, a poly-silicon resistor or the like can be used.

According to this configuration, since a resistance device with a resistance characteristic better than the resistance unit is inserted, the change of the resistance characteristic of the resistance unit due to the signal level of the transmission line can be suppressed far more sufficiently.

The gate width of a MOS transistor composing the above-mentioned resistance unit can also be different from the respective gate width of the other MOS transistors composing the resistance unit.

According to this configuration, the resistance value of the resistance unit can be adjusted over a wider range or in finer steps, and accordingly, the transmission line can be more appropriately matched.

The present invention includes a semiconductor device in which the above-mentioned termination circuit of the present invention is formed, and also includes an electronic device provided with this semiconductor device.

As described above, according to the present invention, the matching characteristic of a termination circuit using a transistor as a termination resistor can be improved.

BRIEF DESCRIPTION OF THE DRAWINGS

The present invention will be more apparent from the following detailed description when the accompanying drawings are referenced, in which.

DESCRIPTION OF THE PREFERRED EMBODIMENTS

The preferred embodiments of the present invention are described below with reference to the drawings.

Figure 1:
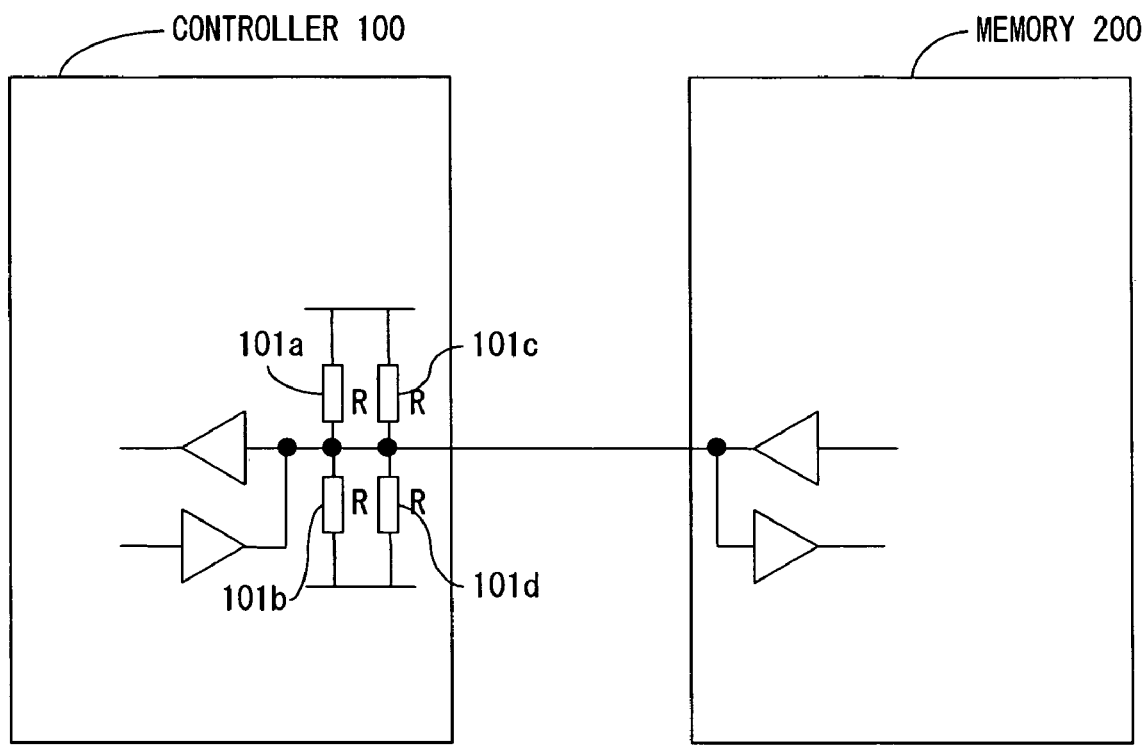
FIG. 1 shows one configuration of the termination circuit.
Figure 2:
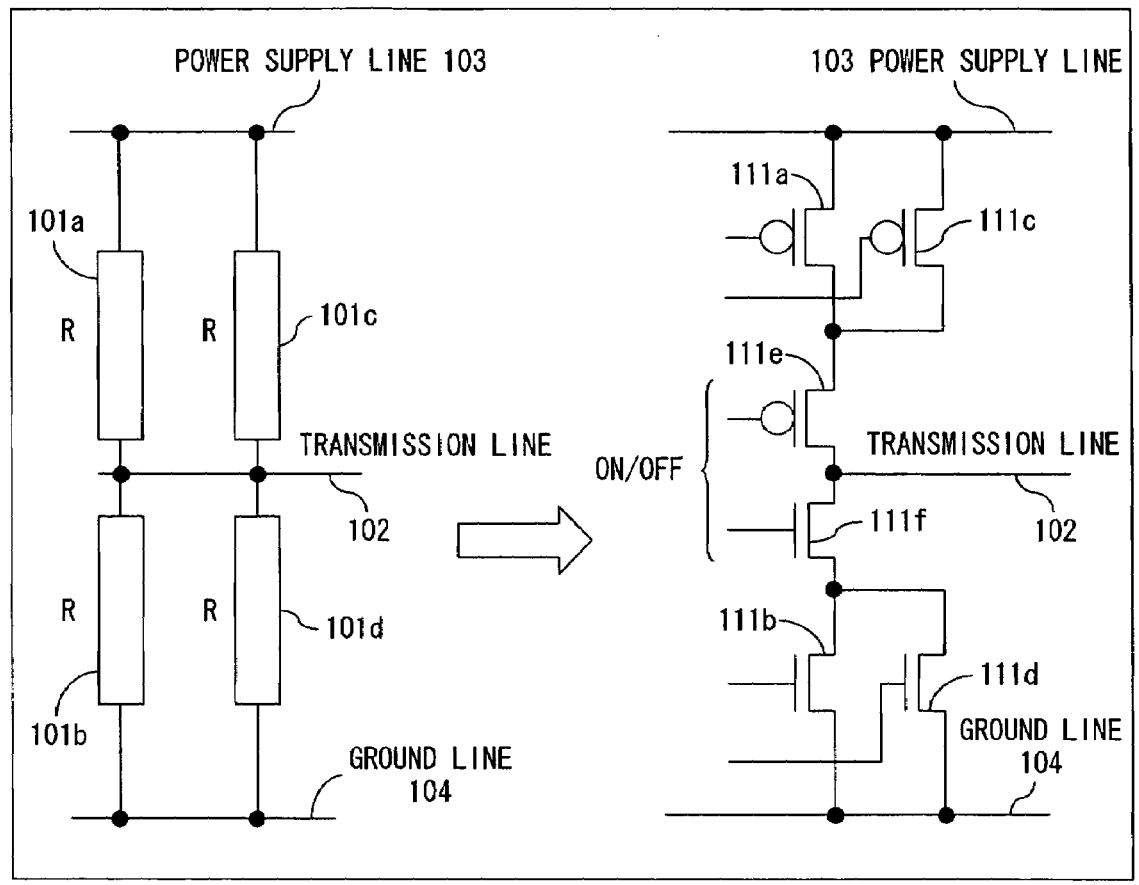
FIG. 2 shows the one detailed configuration on a semiconductor device of the termination circuit shown in FIG. 1.
Figure 3:
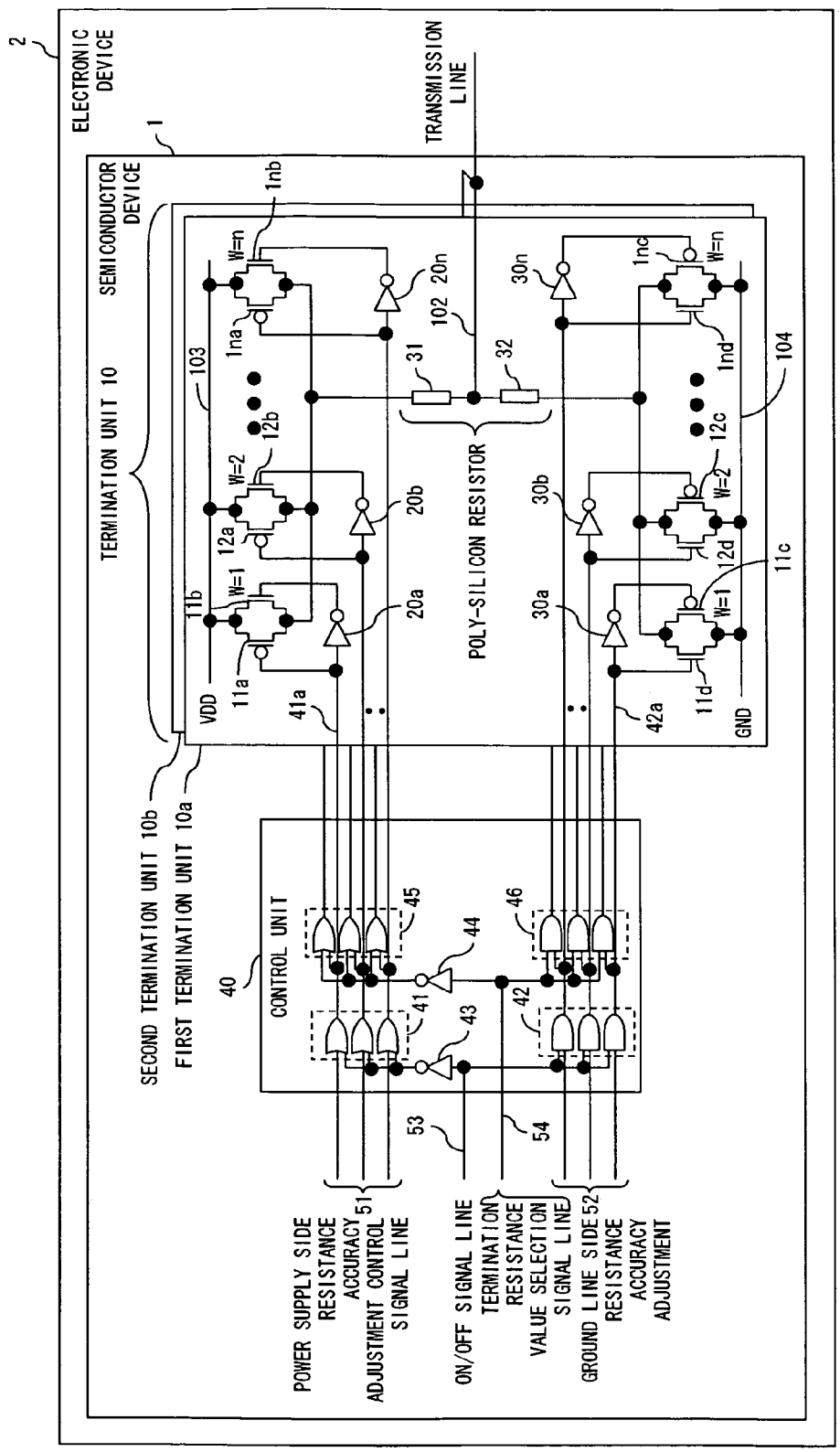
FIG. 3 shows the configuration of the termination circuit for implementing the present invention.

FIG. 3 shows the configuration of the termination circuit for implementing the present invention. In FIG. 3, the same reference numerals are attached to the same lines as in FIG. 2.

In this preferred embodiment, this termination circuit is formed on a single semiconductor substrate in a semiconductor device 1. This semiconductor device 1 is, for example, a central processing unit (CPU), and is provided for an electronic device 2, such as a computer or the like.

The termination circuit shown in FIG. 3 comprises a termination unit 10 for forming Thevenin termination and a control unit 40 for controlling both the switching of activation/inactivation of the terminal circuit and switching of a termination resistance value.

The termination unit 10 comprises both a first termination unit 10a and a second termination unit 10b for each transmission line 102. Although the circuit configuration of the first termination unit is described below, the second termination unit 10b also has the same circuit configuration.

A pair of a P-type transistor 11a and an N-type transistor 11b is connected in parallel between the drain terminal and the source terminal to form a resistance unit. A control line 41a individually led from the control unit 40 is connected both to the gate terminal of the P-type transistor 11a and to the input of an inverter 20a. The output of this inverter 20a is connected to the gate terminal of the N-type transistor 11b. Therefore, if the signal level of the control line 41a becomes L, the gate terminal level of the P-type transistor 11a becomes L, and the gate terminal level of the N-type transistor 11b becomes H by the operation of the inverter 20a. Therefore, the P-type transistor 11a and the N-type transistor 11b are both switched on simultaneously.

As described above, if the potential of the transmission line 102 drops below the gate threshold voltage VthP, the resistance characteristic (proportional relationship between voltage change $\Delta$VDs and current change $\Delta$Ids between the drain terminal and the source terminal) of the P-type transistor 11a at the time of on operation degrades. If the gate threshold voltage of the N-type transistor 11b and voltage between the gate terminal and the source terminal at the time of on operation (that is, voltage VDD of the power supply line 103) are expressed by VthN and Vgs, respectively, the resistance characteristic at the time of on operation degrades when the potential of the transmission line 102 exceeds Vgs-VthN. However, the potential range of the transmission line in which the respective resistance characteristics of the P-type transistor 11a and the N-type transistor 11b both degrade is very narrow. Therefore, if the connection of both the transistors is used as termination resistance, as described above, the degradation of the signal transmission quality of the transmission line can be suppressed more, compared with a case where both the transistors are used without being combined by their parallel connection.

The P-type transistor 11a and the N-type transistor 11b are formed in such a way that the relationship between the gate threshold voltage VthP of the P-type transistor 11a and the gate threshold voltage VthN of the N-type transistor 11b, which are a pair of transistors composing the resistance unit, satisfies the following equation, the far better signal transmission quality of the transmission line 102 can be obtained.

$$VthP < Vgs - VthN \quad (1)$$

In the above-mentioned equation (1), Vgs is voltage between the gate terminal and the source terminal (that is, potential VDD of the power supply line 103) at the time of on operation. In this case, the signal level of the transmission line 102 is lower than the potential VDD of the power supply line 103.

If the resistance unit is formed in such a way as to satisfy the above-mentioned equation, the respective resistance characteristics of the parallel-connected P-type transistor 11a and N-type transistor 11b at the time of on operation both do not always degrade simultaneously, regardless of the signal level of the transmission line 102. Therefore, the change of the resistance characteristic of the resistance unit due to the signal level of the transmission line 102 can be suppressed far more sufficiently.

By transforming equation (1), the following equation (2) can be obtained.

$$VthP + VthN < Vgs \quad (2)$$

Specifically, equation (1) can be satisfied if the P-type transistor 11a and the N-type transistor 11b are formed in such a way that the sum of the respective gate threshold voltage of the P-type transistor 11a and the N-type transistor 11b that compose the resistance unit can become lower than the power supply voltage of the circuit shown in FIG. 3.

Other pairs of transistors 12a, 12b, . . . , 1na, 1nb and inverters 20b, . . . , 20n, respectively, are also connected similarly, and furthermore, the respective drain terminals and source terminals of transistors 11a and 11b, 12a and 12b, . . . , 1na and 1nb, which are these n pairs in total of the respective resistance units, are connected in parallel.

In a pair of the P-type transistor 11c and the N-type transistor 11d, the drain terminal and the source terminal are connected in parallel to form a resistance unit. A control line 42a individually led from the control unit 40 is connected both to the gate terminal of the N-type transistor 11d and to the input of an inverter 30a. The output of this inverter 30a is connected to the gate terminal of the P-type transistor 11c. Therefore, if the signal level of the control line 42a becomes H, the gate terminal level of the N-type transistor 11d becomes H, and the gate terminal level of the P-type transistor 11c becomes L by the operation of the inverter 30a. Therefore, the P-type transistor 11c and the N-type transistor 11d are both switched on simultaneously.

Other pairs of transistors 12c, 12d, . . . , 1nc, 1nd and inverters 30b, . . . , 30n, respectively, are also connected similarly, and furthermore, the respective drain terminals and source terminals of transistors 11c and 11d, 12c and 12d, . . . , 1nc and 1nd, which are these pairs in total of the respective resistance units, are connected in parallel.

The respective drain terminals of transistors 11a and 11b, 12a and 12b, . . . , 1na and 1nb are connected to the power supply line 103, and their respective source terminals are connected to the transmission line 102 through a poly-silicon resistor 31. The respective drain terminals of transistors 11c, 11d, 12c, 12d, . . . , 1nc, 1nd are connected to the transmission line 102 through a poly-silicon resistor 32, and their respective source terminals are connected to the ground line 104.

Next, the circuit configuration of the control unit 40 for switching the on/off operation of each transistor in the termination unit is described.

A power supply side resistance accuracy adjustment control signal line 51 is connected to one of the two inputs of each OR circuits 41, and a ground side resistance accuracy adjustment control signal line 52 is connected to one of the two inputs of each AND circuits 42. An on/off signal line 53 is connected both to the other input of each the AND circuits 42 and to the input of an inverter 43. The output of the inverter 43 is connected to the other input of each the OR circuits 41.

Therefore, if the level of the on/off signal line 53 is L, all of the outputs of the OR circuits 41 are always H, and all of the outputs of the AND circuits 42 are always L. Therefore, the transistors 11a and 11b, 12a and 12b, . . . , 1na and 1nb, 11c and 11d, 12c and 12d, 1nc and 1nd are all always switched off. Namely, in this case, transistors 11a, 11b, 12a, 12b, . . . , 1na, 1nb, 11c, 11d, 12c, 12d, 1nc, 1nd, which are termination resistors, are all severed from the transmission line 102. Furthermore, in this case, these transistors provided for the second termination unit 10b, whose circuit configuration is the same as the first termination unit 10a, are also severed from the transmission line 102. Therefore, in this case, the termination circuit shown in FIG. 3 is always inactive against the transmission line 102.

In the following description, it is assumed that the level of the on/off signal line 53 is H, as long as not specified otherwise.

Each outputs of the OR circuits 41 is connected to one of the two inputs of each OR circuits 45, and each outputs of the AND circuits 42 is connected to one of the two inputs of each AND circuits 46. In this case, a termination resistance value selection signal line 54 is connected both to one of the two inputs of each the AND circuits 46 and to the input of an inverter 44. The output of the inverter 44 is connected to the other input of each the OR circuits 45.

Therefore, if the level of the termination resistance value selection signal line 54 is L, all of the outputs of the OR circuits 45 always become H, and all of the outputs of the AND circuits 46 always become L. Therefore, the transistors provided for the second termination unit 10b of the termination unit 10 are all severed from the transmission line 102. Therefore, in this case, the second termination unit 10b always becomes inactive, and only the first termination unit 10a gives influences to the transmission line 102.

In the following description, it is assumed that the level of the termination resistance value selection line 54 is H, as long as not specified otherwise.

If the signal levels of some of the power supply side resistance value accuracy adjustment control signal lines 51 are L, ones connected to the power supply side resistance accuracy adjustment control signal line 51 through the OR circuits 41 of the n pairs in total of transistors 11a and 11b, 12a and 12b, . . . , 1na and 1nb are switched on. In this case, transistors 11a, 11b, 12a, 12b, . . . , 1na, 1nb, being resistance units, are connected in parallel. Therefore, in this case, of these transistors, the serial combination resistance of the parallel combination resistance of the on resistance of ones switched on by the power supply side resistance accuracy adjustment control signal line 51 and poly-silicon resistance is inserted between the transmission line 102 and the power supply line 103. Namely, this serial combination resistance can be regarded as the resistance 101a shown in FIG. 2.

Similarly, if the signal levels of some of the ground side resistance accuracy adjustment control signal lines 52 are H, ones connected to the ground side resistance accuracy adjustment control signal line 52 through the AND circuits 42 of the n pairs in total of transistors 11c and 11d, 12c and 12d, . . . , 1nc and 1nd are switched on. In this case, transistors 11c, 11d, 12c, 12d, . . . , 1nc, 1nd, being resistance units, are connected in parallel. Therefore, in this case, of these transistors, the serial combination resistance of the parallel combination resistance of the on resistance of ones switched on by the ground side resistance accuracy adjustment control signal line 52 and poly-silicon resistance is inserted between the transmission line 102 and the ground line 104. Namely, this serial combination resistance can be regarded as the resistance 101b shown in FIG. 2.

As described above, since the first termination unit 10a can be regarded as the resistance 101a and 101b shown in FIG. 2, it is clear that the second termination unit 10b with the same configuration as the first termination unit 10a can be regarded as the resistance 101c and 101d. In other words, the termination unit 10 shown in FIG. 3 forms the resistance termination circuit with the Thevenin termination shown in FIG. 2.

In this case, as described above, since the second termination unit 10b can be made inactive against the transmission line 102 by switching the level of the termination resistance value selection signal line 54 to L, the termination resistance value of the termination circuit shown in FIG. 3 can be switched while maintaining Thevenin termination. By switching the level of the on/off signal line 53 to L, the termination circuit shown in FIG. 3 can also be made inactive against the transmission line 102.

Furthermore, by switching the respective signal levels of the power supply side resistance accuracy adjustment control signal line 51 and ground side resistance accuracy adjustment control signal line 52 to switch the selection of pairs of transistors to be switched on, that is, by switching the combination of the resistance units, each resistance value composing Thevenin termination can be adjusted.

In the circuit configuration shown in FIG. 3, the poly-silicon resistor 31 or 32 can also be deleted and short-circuited. Specifically, the parallel connections of the transistors 11a and 11b, 12a, and 12b, . . . , 1na and 1nb can also directly inserted between the transmission line 102 and the ground line 104. Alternatively, the parallel connections of the transistors 11c and 11d, 12c and 12d, . . . , 1nc and 1nd can be inserted between the transmission line 102 and the ground line 104. However, a better resistance characteristic can be obtained by using a pure resistance device, such as a poly-silicon resistor than by utilizing the on resistance of a transistor. Therefore, the configuration shown in FIG. 3 using poly-silicon resistors 31 and 32 can provide the transmission line 102 with better signal transmission quality.

In FIG. 3, one of different characters, "W=1", "W=2", . . . , "W=n" is attached to the side of each of the parallel connections of the transistors 11a and 11b, 12a and 12b, . . . , 1na and 1nb. Each of the characters indicates the relative gate width of each pair of transistors composing the resistance unit. Therefore, in FIG. 3, the gate width of each pair of transistors composing the resistance unit is different from the respective gate width of the other pairs of transistors composing the resistance units.

Figure 4:
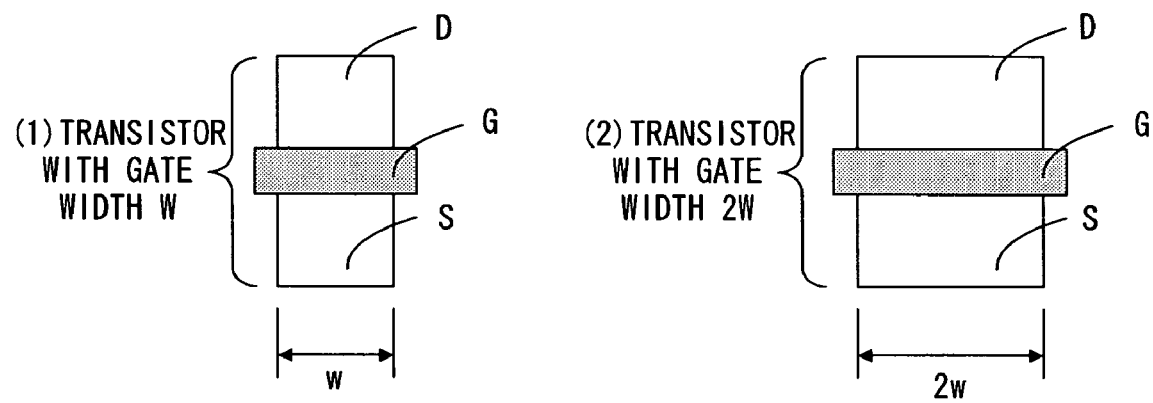
FIG. 4 shows the typical structures of MOS transistors each with different gate width.

Here, FIG. 4 is described. FIG. 4 shows the respective structures of MOS transistors each with different gate width. In FIG. 4, (1) and (2) show the structures of a transistor with gate width w and a transistor with gate width 2w (twice of that of (1)), respectively.

Generally, the on resistance value of a MOS transistor is inversely proportional to gate width. Therefore, in FIG. 4, transistor (1) provides an on resistance value twice that of transistor (2). In other words, if as shown in FIG. 3, each pair of transistors composing the resistance unit is different, each resistance value composing Thevenin termination can be adjusted over a range wider or in finer steps than in a case where each pair of transistors is the same, by switching the respective signal levels of the power supply side resistance accuracy adjustment control signal line 51 and the ground side resistance accuracy adjustment control signal line 52.

The present invention is not limited to the above-mentioned preferred embodiments, and any variations or modifications are available as long as the subject matter of the present invention is not deviated.

What is claimed is:

1. A termination circuit, connected to power supply and ground lines, for terminating a transmission line, comprising:

a first set of resistance units, connected between the transmission line and the power supply line, each formed by connecting a first P-channel type metal oxide semiconductor (MOS) transistor and a first N-channel type MOS transistor in parallel;

a second set of resistance units connected between the transmission line and the ground line, each formed by connecting a second P-channel type MOS transistor and a second N-channel type MOS transistor in parallel;

a first set of control lines respectively connected to said first set of resistance units, each supplying a first signal to switch on and off said first P-channel type MOS transistor and said first N-channel type MOS transistor in a corresponding resistance unit of said first set;

a second set of control lines respectively connected to said second set of resistance units, each supplying a second signal to switch on and off said second P-channel type MOS transistor and said second N-channel type MOS transistor in a corresponding resistance unit of said second set;

a first set of inverters, each inverting the first signal prior to input to one of said first P-channel type MOS transistor and said first N-channel type MOS transistor in each corresponding resistance unit of said first set; and a second set of inverters, each inverting the second signal prior to input to one of said second P-channel type MOS transistor and said second N-channel type MOS transistor in each corresponding resistance unit of said second set.

2. The termination circuit according to claim 1, wherein the first P-channel type MOS transistor and the first N-channel type MOS transistor that form each resistance unit in said first set are formed in such a way that a sum of respective gate threshold voltages of the first P-channel type MOS transistor and the first N-channel type MOS transistor can become lower than a power supply voltage of said circuit.

3. The termination circuit according to claim 1, further comprising a control unit connected to said first and second resistance units, generating the first and second control signals.

4. The termination circuit according to claim 3, further comprising:
  a first resistance device connected in series with said first resistance units between the transmission line and the power line, and
  a second resistance device connected in series with said second resistance units between the transmission line and the ground line.

5. The termination circuit according to claim 4, wherein each of said first and second resistance devices is a poly-silicon resistor.

6. The termination circuit according to claim 3, wherein a gate width of the first P-channel and N-channel type MOS transistors in at least one of said resistance units is different from the-respective gate widths in other of said resistance units.

7. The termination circuit according to claim 4, wherein a gate width of the first P-channel and N-channel type MOS transistors in at least one of said resistance units is different from respective gate widths in other of said resistance units.

8. The termination circuit according to claim 5, wherein a gate width of the first P-channel and N-channel type MOS transistors in at least one of said resistance units is different from respective gate widths in other of said resistance units.

9. A semiconductor device including a termination circuit, connected to power supply and ground lines, for terminating a transmission line, wherein said termination circuit comprises:
  a first set of resistance units, connected between the transmission line and the power supply line, each formed by connecting a first P-channel type metal oxide semiconductor (MOS) transistor and a first N-channel type MOS transistor in parallel;
  a second set of resistance units, connected between the transmission line and the ground line, each formed by connecting a second P-channel type MOS transistor and a second N-channel type MOS transistor in parallel;
  a first set of control lines respectively connected to said first set of resistance units, each supplying a first signal to switch on and off said first P-channel MOS transistor and said first N-channel MOS transistor in a corresponding resistance unit of said first set;
  a second set of control lines respectively connected to said second set of resistance units, each supplying a second signal to switch on and off said first P-channel MOS transistor and said first N-channel MOS transistor in a corresponding resistance unit of said second set;
  a first set of inverters, each inverting the first signal prior to input to one of said first P-channel type MOS transistor and said first N-channel MOS transistor in each corresponding resistance unit of said first set; and
  a second set of inverters, each inverting the second signal prior to input to one of said second P-channel type MOS transistor and said second N-channel type MOS transistor in each corresponding resistance unit of said second set, where said termination circuit is formed on a semiconductor substrate.

10. The semiconductor device according to claim 9, wherein the P-channel type MOS transistor and N-channel type MOS transistor that form each resistance unit in said first set are formed in such a way that a sum of respective gate threshold voltages of the first P-channel type MOS transistor and the first N-channel type MOS transistor can become lower than a power supply voltage of said circuit.

11. The semiconductor device according to claim 9, comprising a control unit connected to said first and second resistance units, generating the first and second control signals.

12. The semiconductor device according to claim 11, further comprising:
  a first resistance device connected in series with said first resistance units between the transmission line and the power line, and
  a second resistance device connected in series with said second resistance units between the transmission line and the ground line.

13. The semiconductor device according to claim 12, wherein each of said first and second resistance devices is a poly-silicon resistor.

14. The semiconductor device according to claim 11, wherein a gate width of the first P-channel and N-channel type MOS transistors in at least one of said resistance units is different from respective gate widths in other of said resistance units.

15. An electronic device including a semiconductor device including a termination circuit, connected to power supply and ground lines, for terminating a transmission line, wherein said termination circuit comprises:
  a first set of resistance units connected between the transmission line and the power supply line, each formed by connecting a first P-channel type metal oxide semiconductor (MOS) transistor and a first N-channel type MOS transistor in parallel;
  a second set of resistance units, connected between the transmission line and the ground line, each formed by connecting a second P-channel type MOS transistor and a second N-channel type MOS transistor in parallel;
  a first set of control lines respectively connected to said first set of resistance units, each supplying a first signal to switch on and off said first P-channel MOS transistor and said first N-channel MOS transistor in a corresponding resistance unit of said first set;
  a second set of control lines respectively connected to said second set of resistance units, each supplying a second signal to switch on and off said first P-channel MOS transistor and said first N-channel MOS transistor in a corresponding resistance unit of said second set;
  a first set of inverters, each inverting the first signal prior to input to one of said first P-channel type MOS transistor and said first N-channel MOS transistor in each corresponding resistance unit of said first set; and
  a second set of inverters, each inverting the second signal prior to input to one of said second P-channel type MOS transistor and said second N-channel type MOS transistor in each corresponding resistance unit of said second set, where said termination circuit is formed on a semiconductor substrate.

16. The electronic device according to claim 15, wherein the P-channel type MOS transistor and N-channel type MOS transistor that form each resistance unit in said first set are formed in such a way that sum of respective gate threshold voltages of the first P-channel type MOS transistor and the first N-channel type MOS transistor can become lower than a power supply voltage of said circuit.

17. The electronic device according to claim 15, further comprising a control unit connected to said first and second resistance units, generating the first and second control signals.

18. The electronic device according to claim 17, further comprising:
   a first resistance device connected in series with said first resistance units between the transmission line and the cower line, and
   a second resistance device connected in series with said second resistance units between the transmission line and the ground line.

19. The electronic device according to claim 18, wherein each of said first and second resistance devices is a polysilicon resistor.

20. The electronic device according to claim 17, wherein a gate width of the first P-channel and N-channel type MOS transistors in at least one of said resistance units is different from respective gate widths in other of said resistance units.

* * * * *

UNITED STATES PATENT AND TRADEMARK OFFICE
CERTIFICATE OF CORRECTION

| | |
|---|---|
| PATENT NO. | : 7,154,981 B2 |
| APPLICATION NO. | : 10/982778 |
| DATED | : December 26, 2006 |
| INVENTOR(S) | : Noriyuki Tokuhiro et al. |

It is certified that error appears in the above-identified patent and that said Letters Patent is hereby corrected as shown below:

Title Page, Item (56) (Other Publications), Line 3-4, below "2215 mailed Nov. 30, 2005." delete "Search Report for European Patent Application No. 04025776.8-2215 mailed Nov. 30, 2005." (2nd occur)

Column 9, Line 26, change "the-respective" to --respective--.

Column 10, Line 11, after "claim 9," insert --further--.

Column 10, Line 35, after "units" insert --,--.

Column 10, Line 67, after "that" insert --a--.

Column 11, Line 12, change "cower" to --power--.

Signed and Sealed this

Twenty-eighth Day of August, 2007

JON W. DUDAS
*Director of the United States Patent and Trademark Office*